US012782216B2

(12) United States Patent
Weber et al.

(10) Patent No.: US 12,782,216 B2
(45) Date of Patent: Nov. 3, 2026

(54) MICROMECHANICAL COMPONENT HAS A MEMBRANE COMPRISING OF GEOMETRICALLY DEFINED REINFORCEMENT STRUCTURES

(71) Applicant: Robert Bosch GmbH, Stuttgart (DE)

(72) Inventors: Heribert Weber, Nuertingen (DE); Andreas Scheurle, Leonberg (DE); Joachim Fritz, Tuebingen (DE); Peter Schmollngruber, Aidlingen (DE); Sophielouise Mach, Reutlingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 302 days.

(21) Appl. No.: 18/044,099

(22) PCT Filed: Oct. 6, 2021

(86) PCT No.: PCT/EP2021/077535
§ 371 (c)(1),
(2) Date: Mar. 6, 2023

(87) PCT Pub. No.: WO2022/096214
PCT Pub. Date: May 12, 2022

(65) Prior Publication Data

US 2023/0304881 A1 Sep. 28, 2023

(30) Foreign Application Priority Data

Nov. 3, 2020 (DE) ..................... 10 2020 213 772.2

(51) Int. Cl.
*G01L 9/00* (2006.01)
*B81B 3/00* (2006.01)

(52) U.S. Cl.
CPC ............ *G01L 9/0048* (2013.01); *B81B 3/007* (2013.01); *B81B 2201/0264* (2013.01); *B81B 2203/0127* (2013.01); *B81B 2203/0307* (2013.01)

(58) Field of Classification Search
None
See application file for complete search history.

(56) References Cited

U.S. PATENT DOCUMENTS 6,462,392 B1 * 10/2002 Pinter ..................... B81B 3/007 257/420
8,921,952 B2 * 12/2014 Dawson ................ B81B 3/0072 438/53

(Continued)

FOREIGN PATENT DOCUMENTS

CN 103964373 A 8/2014
CN 104968599 A 10/2015

(Continued)

OTHER PUBLICATIONS

International Search Report for PCT/EP2021/077535, Issued Jan. 19, 2022.

(Continued)

*Primary Examiner* — Peter J Macchiarolo
*Assistant Examiner* — Jermaine L Jenkins
(74) *Attorney, Agent, or Firm* — NORTON ROSE FULBRIGHT US LLP

(57) ABSTRACT

A micromechanical component. The micromechanical component includes: a membrane; the membrane includes at least one reinforcement structure of a geometrically defined shape, which reinforces the membrane in a defined manner, in the region of at least one anchor structure and/or in the region of at least one connecting structure.

9 Claims, 10 Drawing Sheets

(56) References Cited

U.S. PATENT DOCUMENTS

| | | | | |
|---|---|---|---|---|
| 11,828,669 | B2 * | 11/2023 | Nagel | B81C 1/00658 |
| 11,976,996 | B2 * | 5/2024 | Friedrich | G01L 9/0047 |
| 2002/0108442 | A1 | 8/2002 | Nieminen et al. | |
| 2007/0041076 | A1 | 2/2007 | Zhong et al. | |
| 2012/0248554 | A1 | 10/2012 | Klein et al. | |
| 2016/0023890 | A1 * | 1/2016 | Reinmuth | B81C 1/00285<br>257/419 |
| 2018/0152788 | A1 | 5/2018 | Perletti et al. | |
| 2020/0200631 | A1 * | 6/2020 | Friedrich | G01L 1/148 |

FOREIGN PATENT DOCUMENTS

| | | | |
|---|---|---|---|
| CN | 109279569 | A | 1/2019 |
| CN | 110015633 | A | 7/2019 |
| DE | 102005035058 | A1 | 2/2007 |
| DE | 102015108918 | A1 | 12/2015 |
| DE | 102018222715 | A1 | 6/2020 |
| WO | 2015059073 | A1 | 4/2015 |
| WO | 2019096995 | A1 | 5/2019 |
| WO | 2020011559 | A1 | 1/2020 |

OTHER PUBLICATIONS

Liu, et al.: "A new micromechanical anchor structure", Micronanoelectronic Technology, Issue Z1, (2003), pp. 74, 75, and 83 [with English abstract.]

* cited by examiner

MICROMECHANICAL COMPONENT HAS A MEMBRANE COMPRISING OF GEOMETRICALLY DEFINED REINFORCEMENT STRUCTURES

The present invention relates to a micromechanical component. The present invention further relates to a method for producing a micromechanical component.

BACKGROUND INFORMATION

Micromechanical pressure sensors in which a membrane is tensioned in a frame structure are known; this frame structure can be produced from silicon bulk material (monocrystalline Si wafers) or in a surface micromachining (SMM) process, for example. If an SMM process is used, the frame generally consists of polysilicon.

DE 10 2018 222 715 A1 discloses a pressure sensor in which the membrane is not tensioned by a continuously extending frame, but by individual anchor structures.

In particular in low-pressure sensors, thin and/or large membranes are used so that good sensitivity can be achieved. To prevent these sensors from sustaining any damage at higher pressures (e.g., if they are overloaded), the membrane still has to have high stability. In particular at a tensioning region of the membrane or at edges of membrane bracing structures, high forces that can result in tears in the membrane can develop if it is overloaded.

DISCLOSURE OF THE INVENTION

The object of the present invention is to provide a micromechanical component that is improved in particular in terms of a membrane.

According to a first aspect, the object is achieved by a micromechanical component, comprising:

a membrane; wherein the membrane comprises at least one reinforcement structure of a geometrically defined shape, which reinforces the membrane in a defined manner, in the region of at least one anchor structure and/or in the region of at least one connecting structure.

In this way, the membrane can in particular be more robust in relation to high compressive loads, as a result of which a stress path within the membrane can advantageously be minimized. As a result, this can, for example, largely prevent any tears in or damage to the membrane due to a high compressive load.

According to a second aspect, the object is achieved by a method for producing a micromechanical component, comprising the steps of:

providing a membrane; wherein at least one reinforcement structure of a geometrically defined shape, which reinforces the membrane in a defined manner, is formed in the membrane in the region of at least one anchor structure and/or in the region of at least one connecting structure.

Dependent claims set out preferred developments of the micromechanical component.

An advantageous development of the micromechanical component is characterized in that the reinforcement structure is designed to have a defined overlap over the at least one anchor structure and/or the at least one connecting structure. Advantageously, this can improve a reinforcement effect of the reinforcement structure even further.

Further advantageous developments of the micromechanical component are characterized in that lateral dimensions of a portion of the reinforcement structure that is raised relative to the rest of the membrane are dependent on an extent of the overlap regions and/or a thickness of the membrane.

A further advantageous development of the micromechanical component is characterized in that the reinforcement structure has substantially the same or different lateral dimensions above and below a surface of the membrane. As a result, individual regions of the reinforcement structure are specifically dimensioned, and this can improve a reinforcement effect of the reinforcement structure even further.

A further advantageous development of the micromechanical component is characterized in that the reinforcement structure is integrally formed from one material. In this way, the reinforcement effect of the reinforcement structure can be very precisely specified on the basis of well-known material properties.

A further advantageous development of the micromechanical component is characterized in that the reinforcement structure comprises at least one enclosed additional element. In this way, a reinforcement effect of the reinforcement structure can be improved even further by way of the interaction of two different materials.

A further advantageous development of the micromechanical component is characterized in that the at least one additional element is arranged in the region of at least one anchor structure and/or in the region of at least one connecting structure. In this way, the reinforcement effect of the reinforcement structure can also be optimized even further.

Further advantageous developments of the micromechanical component are characterized in that the reinforcement structure is made of at least one of the following materials: Si, Ge, $SiO_2$, $Si_3N_4$, $GeO_2$, $Ge_3N_4$, SiC, $Al_2O_3$, or silicon-rich silicon nitride. Advantageously, different materials each having their own material parameters can thus be used for implementing the reinforcement structure, as a result of which, for example, production processes for providing the reinforcement structure can be optimally used.

The invention is described in detail below on the basis of multiple figures in conjunction with further features and advantages. Identical or functionally identical elements are provided with identical reference signs. The figures are in particular intended to illustrate the principles essential to the invention and are not necessarily to scale. For the sake of improved clarity, it may be that not all the reference signs are shown in all the figures.

DESCRIPTION OF SPECIFIC EMBODIMENTS

A core concept of the invention is in particular that of reinforcing a membrane of a micromechanical component in the tensioning region and/or in the region of transitions of the membrane, such as bracing structures, in a targeted manner such that, as far as possible, tears do not form in the membrane if it is overloaded.

In connection with the present invention, an "anchor structure" may be a plurality of anchor or anchoring structures that are separate from one another or may be a contiguous, one-piece, or integral anchor or anchoring region. For the sake of simplicity, this distinction is not made again below.

Figure 1:
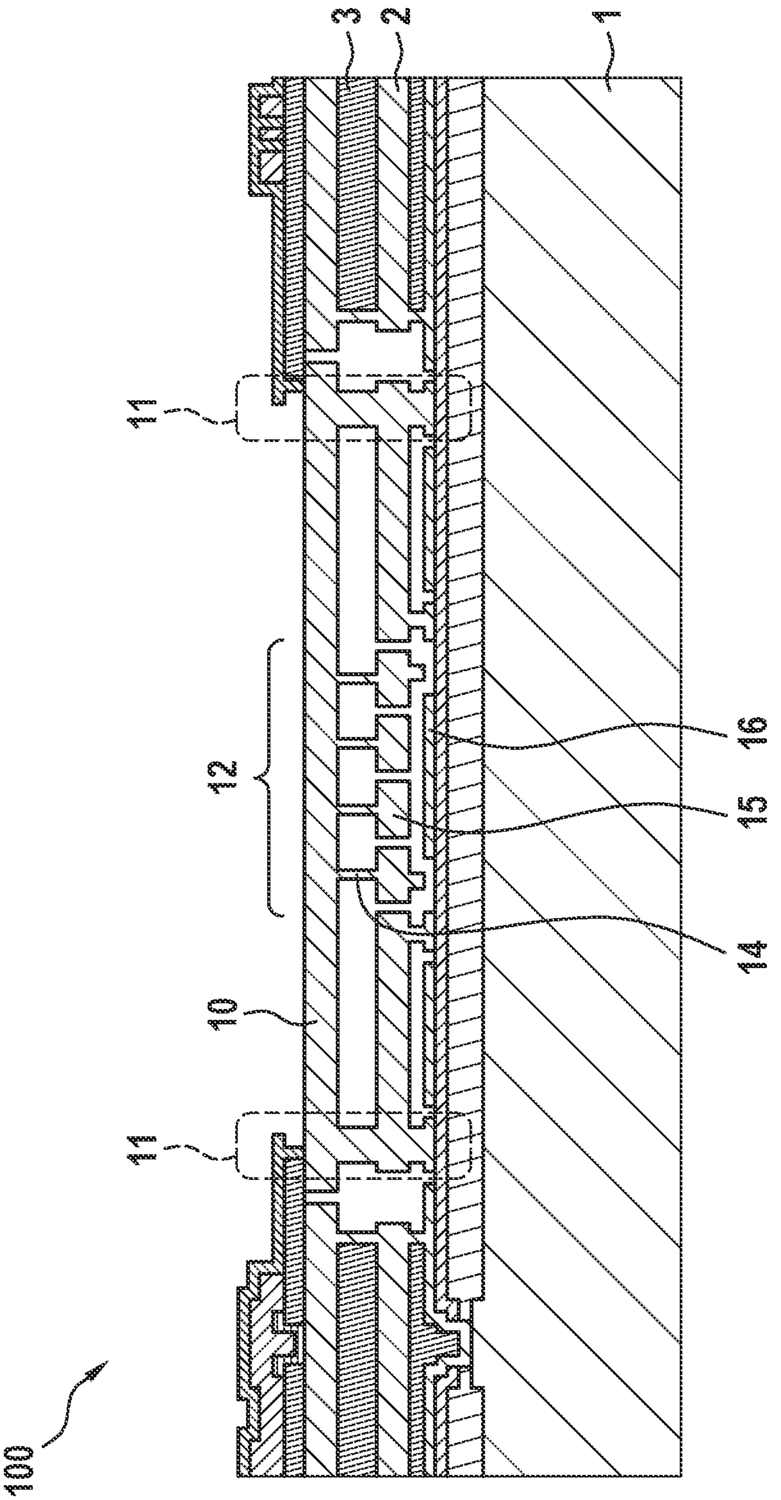
Fig. 1 (related art)
FIG. 1 is a cross-sectional view of a conventional micromechanical sensor.

FIG. 1 is a cross-sectional view of a schematic structure of a conventional micromechanical component 100 in the form of a capacitive micromechanical pressure sensor, as is known from DE 10 2018 222 715 A1, for example. It shows a substrate 1 (preferably a silicon substrate, e.g., a silicon wafer) having a layered structure arranged thereon, which has, inter alia, a functional layer 2 and an upper sacrificial layer 3. Here, a membrane 10 is tensioned in tensioning regions 11 by way of individual anchor structures arranged beside one another. The membrane 10 is braced in a central bracing region 12 by one or more supporting structures, which together fix an upper electrode 15 in place above a lower electrode 16 of a usable capacitor. These supporting structures are connected to the membrane 10 via connecting structures 14 and thus locally brace the membrane 10.

Figure 2:
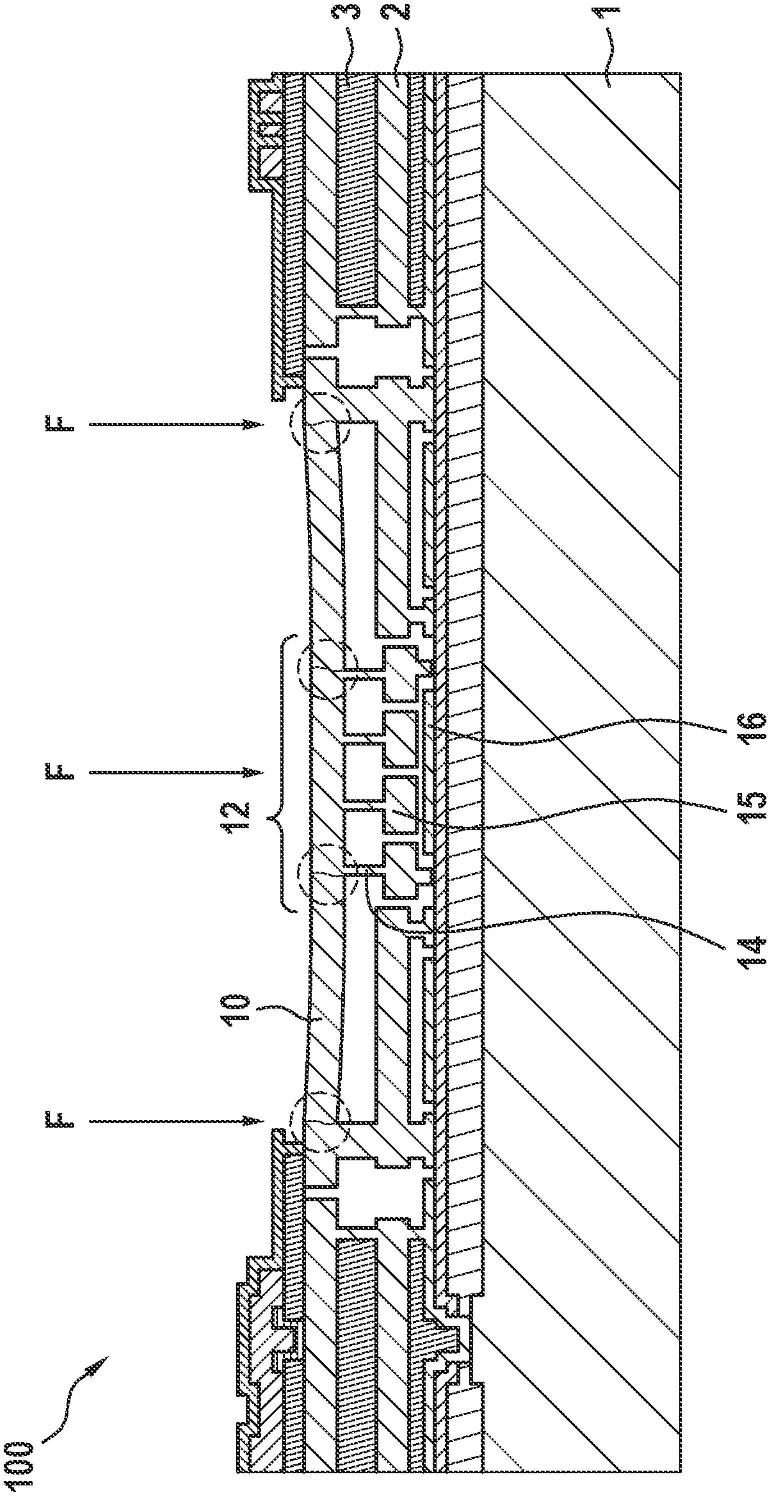
Fig. 2 (related art)
FIG. 2 is a cross-sectional view through the conventional micromechanical sensor from FIG. 1 showing the problem of tear formation.

FIG. 2 shows a scenario in which a high mechanical pressure F is applied to the membrane 10. If this pressure F is too high, in the worst case tears can develop in the tensioning region 11 and/or in the bracing region 12 of the membrane 10. Possible positions of tears of this kind are indicated by dashed circles.

Figure 3A:
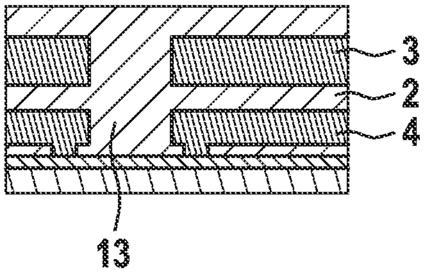
FIG. 3 shows a plurality of views of a proposed reinforcement structure of a proposed micromechanical component in the tensioning region of the membrane.
Figure 3B:
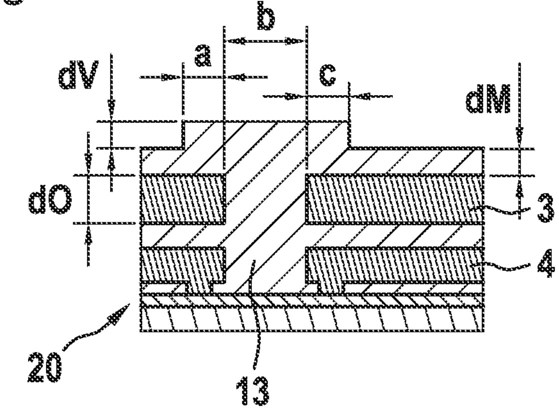
Figure 3B:
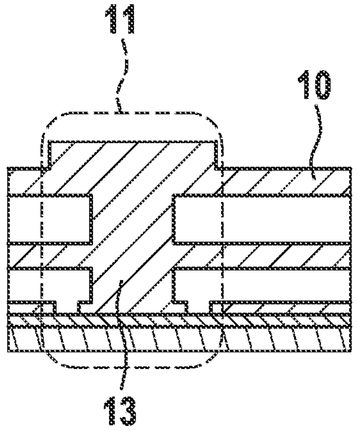

To make it possible to prevent tears of this kind in the membrane 10, it is proposed to reinforce the tensioning region 11 of a membrane 10 in a defined manner, as shown in FIGS. 3*b*)-3*d*).

FIG. 3*a*) is a cross-sectional view through a conventional anchor structure 13 in the tensioning region 11, as known from DE 2018 222 715 A1, for example. The anchor structure 13 comprises a functional layer 2 (e.g., made of polysilicon) and is in direct contact with the membrane 10 or the membrane layer. In this case, the functional layer 2 is arranged within a lower sacrificial layer 4 and in an upper sacrificial layer 3 so as to completely penetrate the lower sacrificial layer 4 and the upper sacrificial layer 3. Various options are taken into consideration to be able to reinforce the tensioning region 11, as explained in the following.

For example, as shown in FIG. 3*b*), the upper face of the membrane 10 is thickened or reinforced by an additional layer, which can extend beyond the anchor structure 13 and thus reinforces the membrane in the region of the transition between the anchor structure 13 and the membrane 10. Preferably, a layer of polysilicon can be used to provide this reinforcement, so as to, for example, keep thermal influences on sensor performance low and/or to provide good chemical etching stability in relation to a sacrificial layer etching medium. If the sacrificial layer 3 and the sacrificial layer 4 consist of $SiO_2$, for example, the reinforcement layer should have the highest possible etching resistance to an etching medium in the form of HF in liquid or gaseous form. As expressed on the basis of the following equations, this reinforcement can extend beyond the region, or the width and length, i.e., the lateral dimensions, of the anchor structure 13, although respective projecting portions do not necessarily have to have the same dimensions.

The geometric dimensions of the reinforcement structure 20 set out below are possible, with the term "as desired" being understood in the following to mean a range of suitable dimensioning parameters in connection with possible dimensioning parameters of a micromechanical component, such as those for the geometric dimensions of a membrane. Here, it is assumed that, for example, a thickness of the membrane 10 of the micromechanical component 100 can be a few tens of nanometers to several hundreds of micrometers.

$$a,c>=0$$

$$a=c$$

$$a>c$$

$$a<c$$

$$dV=\text{as desired}$$

$$dVU<dO$$

$$dM=\text{as desired}$$

$$a',c'>=0$$

$$a'=c'$$

$$a'>c'$$

$$a'<c'$$

$$a'=a$$

$$a'>a$$

$$a'<a$$

$$c'=c$$

$$c'>c$$

$$c'<c$$

Figure 3C:
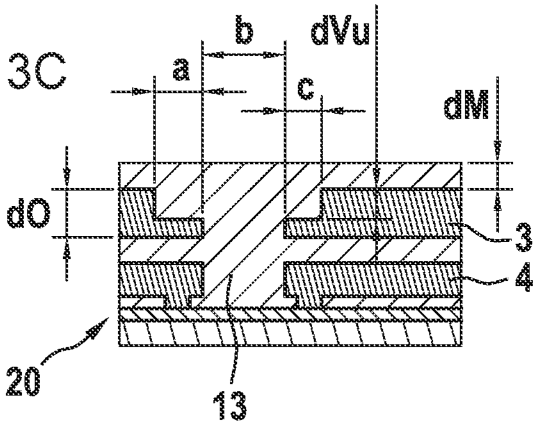
Figure 3C:
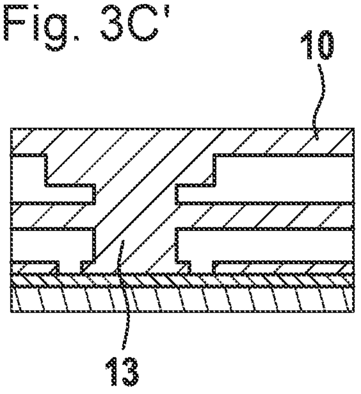

FIG. 3*c*) shows a further variant of the reinforcement structure 20 in which the membrane can be reinforced in the region of the transition between the anchor structure 13 and the membrane 10. Here too, the reinforcement layer can consist of silicon and extend beyond the anchor structure 13. In this case too, projecting portions having the widths a and c can have different dimensions. While the thickness of the reinforcement layer in FIG. 3*b*) can be as desired, in the variant in FIG. 3*c*), it should be less than the thickness of the uppermost sacrificial layer 3 (e.g., made of $SiO_2$), which is located between the membrane layer and the next functional layer 2 (e.g., made of polysilicon) positioned thereunder.

Figure 3D:
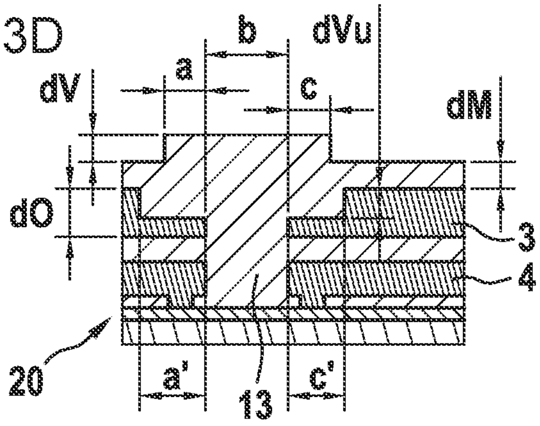
Figure 3D:
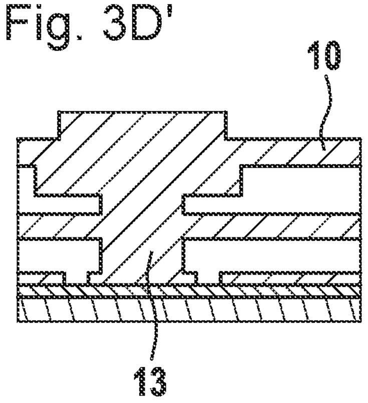

FIG. 3*d*) shows a combination of the variants shown in FIGS. 3*b*) and 3*c*). In this case, reinforcement layers are provided above and below the membrane layer in the region of the anchor structure 13 and can all project beyond the anchor structure 13 to different extents. FIG. 3*b*')-3*d*') show the respective variants of the reinforcement structure 20 after the sacrificial layers 3, 4 have been removed.

While the variants in FIGS. 3*b*)-3*d*) show the reinforcement of the membrane tensioning by thickening by way of one layer, in principle there is also the option of stabilizing the tensioning region 11 by way of a plurality of reinforcement layers. As a result, for example, the stress and stress curve in the tensioning region 11 of the membrane 10 can be influenced and set in a targeted manner.

Figure 4A:
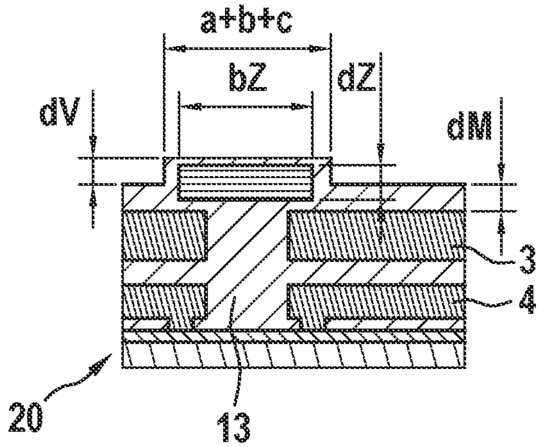
FIG. 4 shows further alternative variants of the proposed reinforcement structure in the tensioning region of a proposed micromechanical component.
Figure 4A:
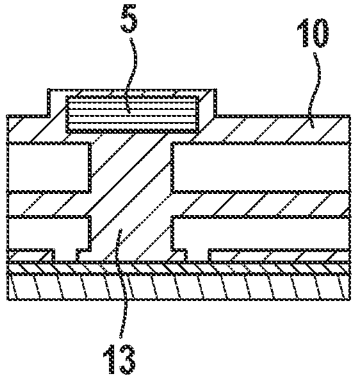

FIGS. 4*a*) to 4*c*) show possible variants of the proposed reinforcement structure 20. FIG. 4*a*), for example, shows a variant in which an additional element or an additional layer 5 is integrated in the reinforced region of the membrane tensioning, as shown in FIG. 3*b*). If the reinforced region consists completely of polysilicon, the additional element 5 or the additional layers are completely surrounded by polysilicon. In this case, the thickness of the enveloping silicon layer can be, for example, the same all over, different all over, or the same only in part. The width of the reinforced region results from the sum of overhang widths plus a width of the anchor structure 13.

A further variant derives from FIG. 3*c*). In this figure, a reinforcement structure 20 is provided which extends, in the tensioning region 11 in the region of the anchor structure 13, into the region below the membrane 10. One or more additional layers can in turn be integrated in said structure, which layers are surrounded by silicon, having optionally different layer thicknesses, analogously to that explained above.

Figure 4B:
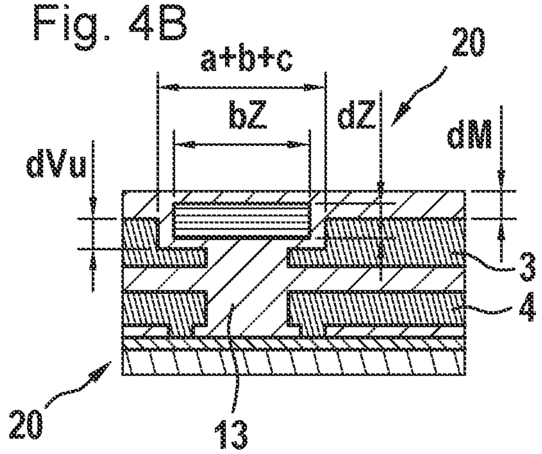
Figure 4B:
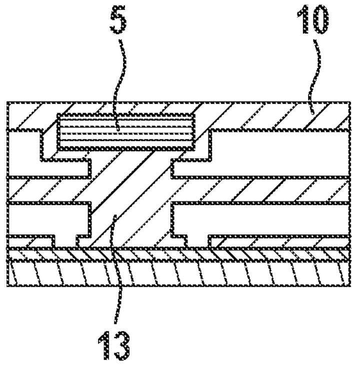
Figure 4C:
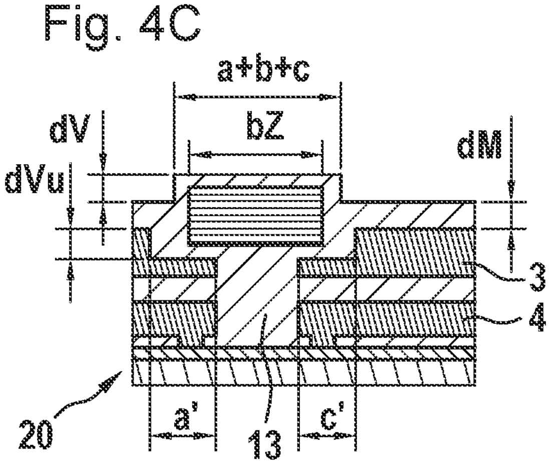
Figure 4C:
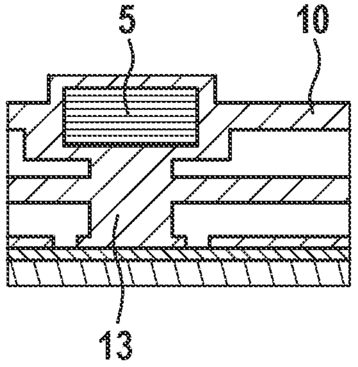

FIG. 4*c*) shows a combination of the previously described variants. FIG. 4*a*')-4*c*') again show the respective variants of the reinforcement structure 20 after the sacrificial layers 3, 4 have been removed.

With reference to the parameters shown in FIGS. 4*a*) to 4*c*), the following is applicable:

$$a+b+c>bZ$$

$$dV+dM>dZ$$

$$dV+dVu+dM>dZ$$

$$a',c'>0$$

$$a'=c'$$

$$a'>c'$$

$$a'<c'$$

$$a'=a$$

$$a'>a$$

$$a'<a$$

$$c'=c$$

$$c'>c$$

$$c'<c$$

FIGS. 4*a* and 4*b* illustrate that the additional element 5 can be arranged substantially above or below the membrane surface.

Figure 5A:
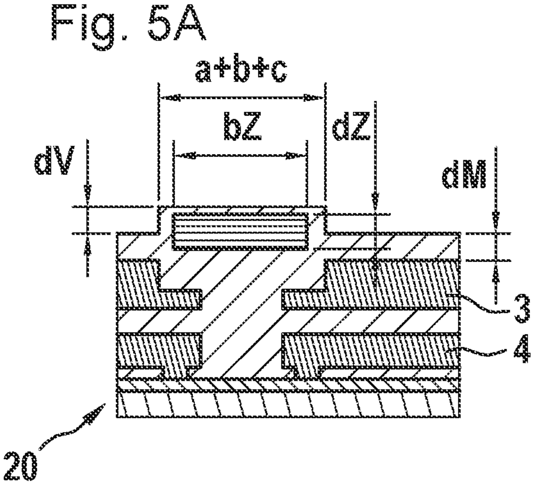
FIG. 5 shows further variants of the proposed reinforcement structure in the tensioning region of a proposed micromechanical component.
Figure 5A:
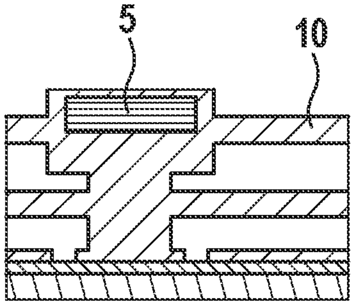
Figure 5B:
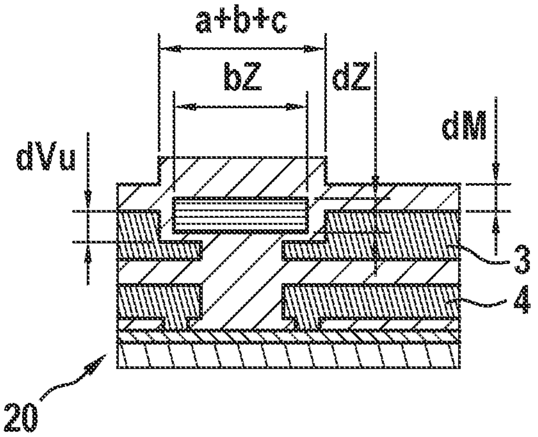
Figure 5B:
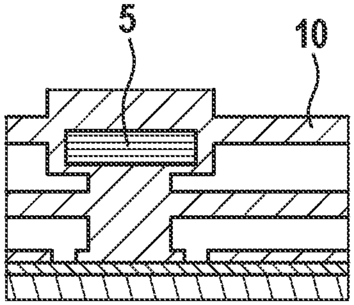

This also applies to the arrangements in FIGS. 5*a*) and 5*b*), which show two further variants of FIG. 4*c*) in which the additional element 5 can be arranged substantially above the membrane surface (FIG. 5*a*)) or below the membrane surface (FIG. 5*b*)). FIGS. 5*a*) and 5*b*) also show that additional reinforcement layers can be present without an additional element 5. If the additional element or the additional layer 5 consists of a layer or layer system that is resistant to the sacrificial layer etching medium, it is also possible to consider only enveloping the additional element or the additional layer 5 with silicon in part and to refrain from enveloping it completely.

As already explained, in the capacitive pressure sensor mentioned in DE 2018 222 715 A1, the membrane is tensioned by singular, substantially adjacent, anchor structures.

Figure 6D:
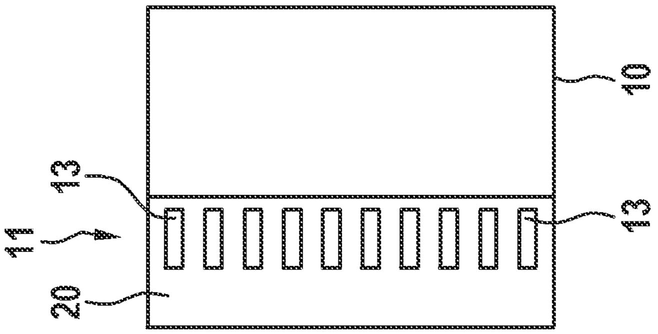
FIG. 6 shows plan views of proposed reinforcement structures in the tensioning region of a membrane of a micromechanical component.
Figure 6C:
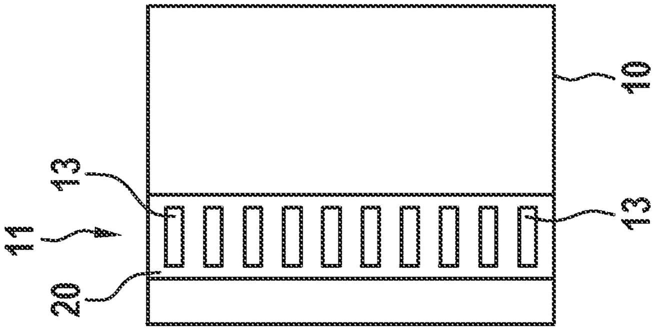
Figure 6B:
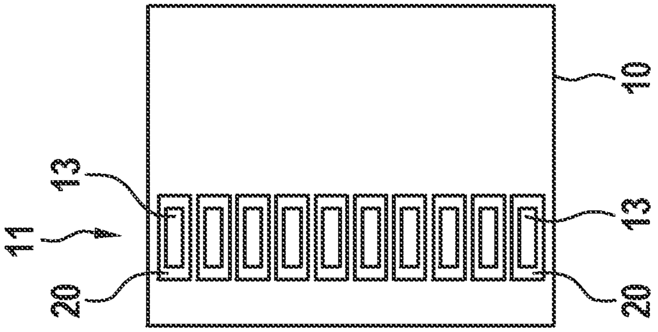
Figure 6A:
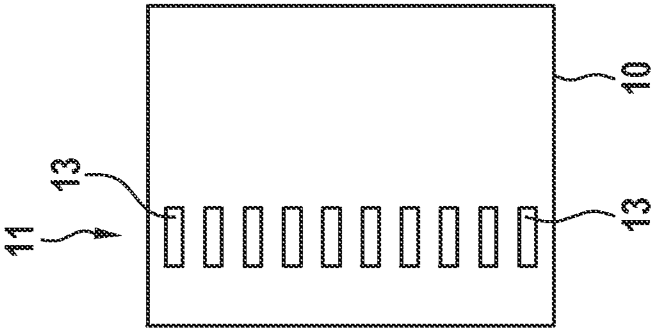

FIG. 6*a*) is a plan view of a detail of the membrane 10 of the tensioning region 11 described in DE 10 2018 222 715 A1; it can be seen that the membrane is tensioned at singular anchor structures 13.

FIG. 6*b*) is a plan view in which a plurality of proposed reinforcement structures 20 are not contiguous only in the region around singular anchor structures 13. Here, in the plane for both directions around the anchor structures 13, the same requirements or assumptions as described above in connection with the variants in FIGS. 3*a*)-3*d*) and FIGS. 4*a*)-4*c*) are then applicable to the reinforcement structures 20.

FIG. 6*c*) is a plan view of a further variant in which the reinforcement structures 20 of adjacent anchor structures 13 transition into one another at least in part and form a larger, contiguous reinforcement region. As shown in FIG. 6*c*), this reinforcement region can be arranged in the region of the anchor structure 13, but, as shown in FIG. 6*c*), does not necessarily have to be symmetrical in this region.

Alternatively, the reinforcement region can extend away from the anchor structure 13 asymmetrically, as shown in FIG. 6*d*). In extreme cases, the reinforcement structure 20 can be located in the entire surface outside the membrane region. In this case, by way of example, the membrane region can extend up to the reinforcement structure 20 or up to the anchor structure 13 or comprise the anchor structure 13.

Figure 7C:
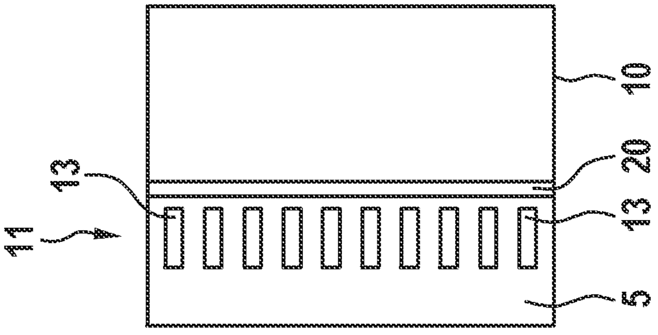
FIG. 7 shows plan views of proposed reinforcement structures in the tensioning region of a membrane of a proposed micromechanical component.
Figure 7B:
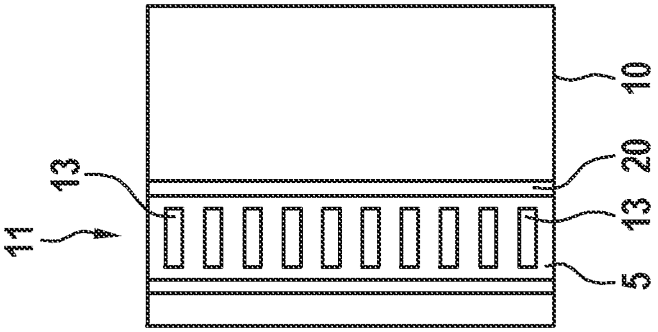
Figure 7A:
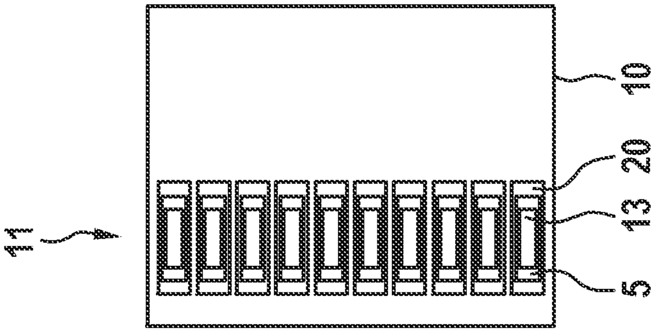

FIGS. 7*a*)-7*c*) are views corresponding to FIGS. 6*b*)-6*d*), in which an additional element or an additional reinforcement layer 5 can still be present. Furthermore, it is also conceivable not to design a reinforcement structure 20 to extend in a straight line in parallel with membrane tensioning, but instead to design it in a convex or concave manner, or in some other specific manner, in the direction of membrane tension.

Figures 8A, 8B, 8C, 8D:
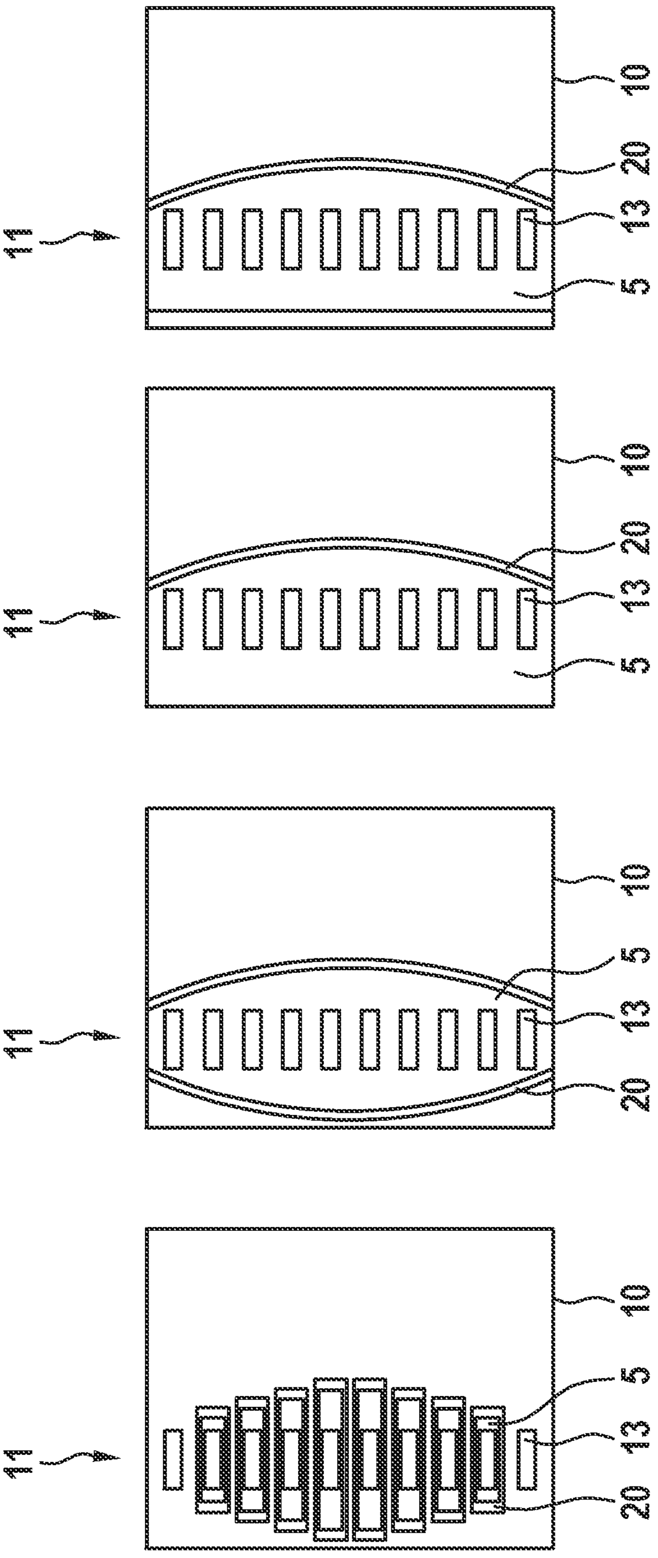
FIG. 8 shows plan views of proposed reinforcement structures in the tensioning region of a proposed micromechanical component.

FIGS. 8*a*)-8*d*) show examples of an outwardly domed (convex) extension of a reinforcement structure 20 along a tensioning region 11. FIG. 8*a*) shows a variant in which singular, non-contiguous reinforcement structures 20 create a convex extension in the direction of membrane tension, while FIG. 8*b*) shows a contiguous region. While, in FIGS. 8*a*) and 8*b*), the outwardly domed reinforcement structure 20 is symmetrical about the anchor structures 13 in the direction of membrane tensioning, variants can also be provided in which the outwardly domed reinforcement structure 20 only extends into the membrane region, for example, as shown in FIGS. 8*c*) and 8*d*).

The plan view in FIG. 8*c*) shows that a contour of the reinforcement structure(s) 20 can extend into the membrane region in an outwardly domed shape starting from a straight arrangement of the anchor structure(s) 13 and can be formed over the entire surface in the surrounding membrane region directed away from the membrane, starting from the anchor structure(s) 13.

The plan view in FIG. 8*d*) shows that regions of the reinforcement structure 20 can be asymmetrical about the anchor structure 13 and can have a parallel and/or non-parallel extension.

By way of a curved extension of a reinforcement structure 20 in the region of a tensioning region 11, the stress path in a membrane surface can be taken into account and tensioned membrane regions which are subject to a higher mechanical load are accordingly reinforced while at the same time minimizing the influence of the reinforcement structure 20 on the membrane properties.

Figure 9A:
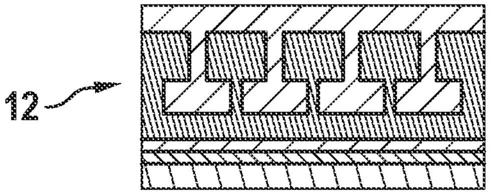
FIG. 9 shows variants of the proposed reinforcement structure in the bracing region of a membrane of a proposed micromechanical component.

FIGS. 9*a*)-9*e*) show an application of that explained above to the bracing region 12 of the pressure sensor described in DE 10 2018 222 715 A1 in the region of the usable capacitor. FIG. 9*a*) shows an example of a conventional bracing region 12.

Figure 9B:
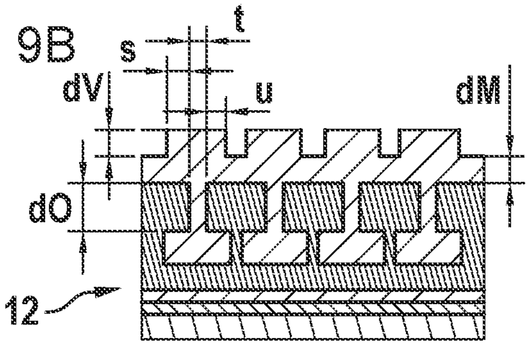
Figure 9B:
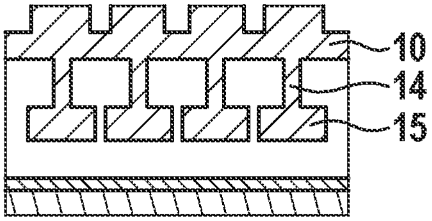

Analogously to FIG. 3*b*), FIG. 9*b*) shows proposed reinforcement structures 20 which are located on the membrane 10 in the region around connecting structures so as to be non-contiguous.

Figure 9C:
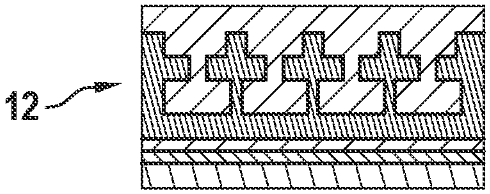
Figure 9C:
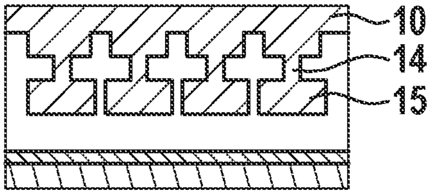

FIG. 9*c*) is analogous to FIG. 3*c*), in which the non-contiguous reinforcement structures 20 are located below the membrane 10 in the region around connecting structures.

Figure 9D:
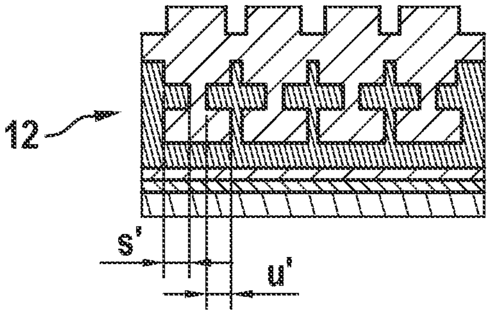
Figure 9D:
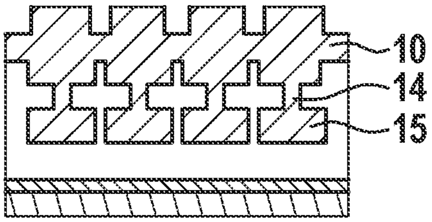
Figure 9E:
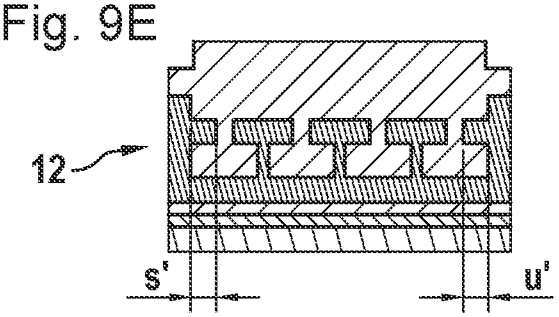
Figure 9E:
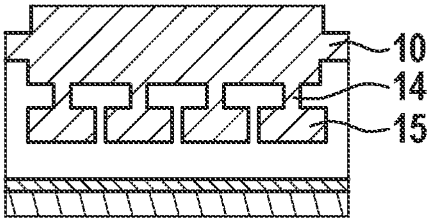

FIG. 9*d*) shows a combination of the previously described variants. FIG. 9*e*) shows a variant in which at least partly adjacent reinforcement structures 20 merge into one another in the region of connecting structures 14 and form a larger, contiguous reinforcement surface. In this example, this applies to reinforcement structures 20 above and below the membrane layer. This is, however, equally possible if the reinforcement structure(s) are only located above or below the membrane layer.

With reference to the parameters shown in FIGS. 9*a*) to 9*e*), the following is applicable:

$s,u>=0$ $s=u$ $s>u$ $s<u$ $dV$=as desired $dVu<dO$ $dM$=as desired $s',u'>=0$ $s'=u'$ $s'>u'$ $s'<u'$ $s'=s$ $s'>s$ $S'<S$ $u'=u$ $u'>u$ $u'<u$ By way of a curved extension of a reinforcement structure 20 in the bracing region 12 of a membrane 10, the stress path in a membrane surface can be taken into account and braced membrane regions which are subject to a higher mechanical load are accordingly reinforced while at the same time minimizing the influence of the reinforcement structure 20 on the membrane properties. In the figures shown, the reinforcement layer(s) and the additional layer(s) 5 are shown to be rectangular for the sake of simplicity. In principle, however, they can be any shape, for example, they can be lenticular, elliptical, cup-shaped, champagne-coupe-shaped, rectangular, or square, with rounded corners and edges, etc., or can be combinations of said shapes.

The reinforcement structures 20 and the additional reinforcement layers 5 can, e.g., be made of electrically conducting, semiconducting, or non-conducting materials such as Si, Ge, $SiO_2$, $Si_3N_4$, $GeO_2$, $Ge_3N_4$, SiC, $Al_2O_3$, silicon-rich silicon nitride, etc., or combinations of these materials. In addition, these materials can be provided with dopants in a targeted manner, as is known in semiconductor technology, for example.

Figure 10:
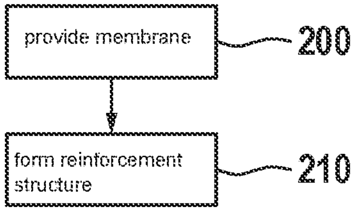
FIG. 10 shows a schematic sequence for producing a proposed micromechanical component.

FIG. 10 shows a possible schematic sequence of a method for producing a proposed micromechanical component 100.

In a step 200, a membrane 10 is provided.

In a step 210, at least one reinforcement structure 20 of a geometrically defined shape, which reinforces the membrane 10 in a defined manner, is formed in the membrane 10 in the region of at least one anchor structure 13 and/or in the region of at least one bracing structure 12.

Advantageously, a plurality of different forms of implementation are conceivable for the micromechanical component, for example in the form of a capacitive pressure sensor, a microphone, a piezo-resistive pressure sensor, etc.

What is claimed is:

1. A micromechanical component, comprising:

a membrane;

at least one anchor structure;

at least one reinforcement structure of a geometrically defined shape, the reinforcement structure overlapping the at least one anchor structure in the plane of the membrane and extending laterally beyond the lateral dimensions of the at least one anchor structure, the reinforcement structure including at least one enclosed additional element, wherein the reinforcement structure is configured to reduce stress at the transition between the membrane and the anchor structure.

2. The micromechanical component as recited in claim 1, wherein the additional element is completely surrounded by polysilicon.

3. The micromechanical component as recited in claim 1, wherein the at least one reinforcement structure includes a plurality of reinforcement structures and the at least one anchor structure includes a plurality of individual anchor structures, and wherein the reinforcement structures of the individual singular anchor structures are not contiguous.

4. The micromechanical component as recited in claim 1, wherein the reinforcement structure is configured to have a defined overlap over the at least one anchor structure.

5. The micromechanical component as recited in claim 4, wherein lateral dimensions of a portion of the reinforcement structure that is raised relative to the rest of the membrane are dependent on an extent of the overlap region and/or a thickness of the membrane.

6. The micromechanical component as recited in claim 1, wherein the reinforcement structure has substantially the same or different lateral dimensions above and below a surface of the membrane.

7. The micromechanical component as recited in claim 1, wherein the reinforcement structure is integrally formed from one material.

8. The micromechanical component as recited in claim 1, wherein the reinforcement structure is made of at least one of the following materials: Si, or Ge, or $SiO_2$, or $Si_3N_4$, or $GeO_2$, or $Ge_3N_4$, or SiC, or $Al_2O_3$, or silicon-rich silicon nitride.

9. A method for producing a micromechanical component, comprising the following steps:

providing a membrane;

providing at least one anchor structure;

and forming in the membrane in a region of at least one anchor structure at least one reinforcement structure of a geometrically defined shape, the reinforcement structure overlapping the at least one anchor structure in the plane of the membrane and extending laterally beyond the lateral dimensions of the at least one anchor structure, the reinforcement structure including at least one enclosed additional element, wherein the reinforcement structure is configured to reduce stress at the transition between the membrane and the anchor structure.

* * * * *